(12) United States Patent
Mastromatteo (10) Patent No.: US 7,432,587 B2
(45) Date of Patent: Oct. 7, 2008

(54) INTEGRATED DEVICE INCLUDING CONNECTIONS ON A SEPARATE WAFER

(75) Inventor: Ubaldo Mastromatteo, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 30 days.

(21) Appl. No.: 11/005,832

(22) Filed: Dec. 7, 2004

(65) Prior Publication Data
US 2005/0156320 A1 Jul. 21, 2005

Related U.S. Application Data

(62) Division of application No. 10/037,485, filed on Dec. 19, 2001, now Pat. No. 6,841,453.

(30) Foreign Application Priority Data
Dec. 29, 2000 (EP) .................................. 00830867

(51) Int. Cl.
H01L 23/02 (2006.01)
H01L 23/48 (2006.01)
(52) U.S. Cl. ...................... 257/686; 257/685; 257/777
(58) Field of Classification Search ................. 257/67, 257/382–384, 377, 620, 685, 686, 723, 777, 257/778
See application file for complete search history.

(56) References Cited

U.S. PATENT DOCUMENTS

| 3,254,389 A | 6/1966 | Andres et al. ................ 29/25.3 |
| 5,406,701 A | 4/1995 | Pepe et al. .................... 29/840 |
| 5,627,106 A | 5/1997 | Hsu ............................ 438/459 |
| 5,654,226 A | 8/1997 | Temple et al. ................ 438/458 |
| 5,756,395 A | 5/1998 | Rostoker et al. ............. 438/622 |
| 5,801,083 A | 9/1998 | Yu et al. ...................... 438/424 |
| 5,858,814 A | 1/1999 | Goossen et al. ............. 438/107 |
| 6,479,320 B1 * | 11/2002 | Gooch ......................... 438/109 |

FOREIGN PATENT DOCUMENTS

| EP | 0908951 | 4/1999 |
| EP | 0 993 034 A2 | 4/2000 |

OTHER PUBLICATIONS

Ismail, M.S. et al., "Platinum Silicide Fusion Bonding," *Electronic Letters*, 27(13):1153-1155, Jun. 20, 1991.
Fukuroda, A. et al., "Si Wafer Bonding with Ta Silicide Formation," *Japanese Journal of Applied Physics*, 30(10A):L1693-L1695, Oct. 1991.
Chaput, M., "Aligning Wafer Stacks with Machine Vision," *Global Semiconductor*, Imaging Technology Incorporated.
Ismail, M.S. et al., "Platinum Silicide Fusion Bonding," *Electronic Letters*, 27(13):1153-1155, Jun. 20, 1991.
Fukuroda, A. et al., "Si Wafer Bonding with Ta Silicide Formation," *Japanese Journal of Applied Physics*, 30(10A):L1693-L1695, Oct. 1991.

* cited by examiner

*Primary Examiner*—Hung Vu
(74) *Attorney, Agent, or Firm*—Lisa K. Jorgenson; Robert Iannucci; Seed IP Law Group PLLC (57) ABSTRACT

An integrated semiconductor device includes semiconductor regions and isolation regions in a first wafer of semiconductor material, and, on a second wafer of semiconductor material, interconnection structures. Plug elements provide electrical and mechanical coupling between the first and second wafers. Each plug element includes a first region coupled to the first wafer and a second region formed of a selected metal bonded with the semiconductor regions of the first wafer, forming a metal silicide.

27 Claims, 8 Drawing Sheets

INTEGRATED DEVICE INCLUDING CONNECTIONS ON A SEPARATE WAFER

CROSS-REFERENCE TO RELATED APPLICATION

This application is a divisional of U.S. patent application Ser. No. 10/037,485, filed Dec. 19, 2001, now pending, which application is incorporated herein by reference in its entirety.

BACKGROUND OF THE INVENTION

1. Field of the Invention

The present invention refers, in general, to integrated devices having connections on a separate wafer, and, in particular, to bonding structures formed between a wafer comprising active or mechanical structures a wafer comprising interconnection structures.

2. Description of the Related Art

As is known, standard processes for manufacturing integrated circuits involve carrying out individual process steps in a sequential way. The manufacture of micro-integrated structures (so-called micro-electromechanical systems, or MEMS) and their control circuits in a same monolithic device has required a certain number of manufacture steps for defining the micro-integrated structures within the process of manufacturing traditional electronic components, with an increase in complexity which is not always sustainable. Consequently, in many cases the choice is made to carry out parallel manufacturing processes to obtain, on one hand, the control circuits, and, on the other, the micro-integrated structures, and at a certain point to bond the obtained structures, so that the two processes may involve only a few non-critical common steps.

Thereby, it is possible to continue to exploit the potential of planar technology (batch-type processes), whilst the minimum time required for obtaining a finished device (so-called "cycle time") is markedly reduced. In addition, with parallel processing, it is possible to separate parts and processing steps that could lead to contamination.

Recently a manufacturing process has been proposed (see U.S. Pat. No. 5,736,395) based upon parallel manufacture of a first substrate housing an integrated circuit and a second substrate comprising the interconnections for the integrated circuit, and bonding the two substrates together in the final manufacturing steps.

The separation of the operations for forming the integrated components in a silicon substrate from the operations for forming interconnections enables a simplification of the process as a whole.

In the parallel process proposed, bonding of the two substrates is obtained by forming, on both substrates, appropriate metal contact regions coated with a bonding layer of a low-melting alloyable metal, for example gold or palladium.

The need to include steps for depositing and defining the metal contact regions and the bonding layer on top of both substrates is, however, disadvantageous in so far as it does not enable separation of the operations for forming components integrated in the silicon from the metallurgical operations for forming interconnections. Consequently, the techniques for forming the interconnections risk affecting the components that belong to the integrated circuit and may give rise to undesired charging phenomena or to contamination.

In addition, the described parallel process requires forming through holes in the substrate carrying the interconnections for aligning the two substrates in the bonding step, with an increase in costs and in manufacturing times for forming the corresponding masks and the holes.

SUMMARY OF THE INVENTION

An embodiment of the present invention provides a device having integrated structures including semiconductor regions and isolation regions in a first wafer of semiconductor material, and, on a second wafer of semiconductor material, interconnection structures. Plug elements provide electrical and mechanical coupling between the first and second wafers. Each plug element includes a first region coupled to the first wafer and a second region formed of a selected metal bonded with the semiconductor regions of the first wafer, forming a metal silicide.

BRIEF DESCRIPTION OF THE SEVERAL VIEWS OF THE DRAWING(S)

For a better understanding of the present invention, preferred embodiments thereof are now described, purely to provide non-limiting examples, with reference to the attached drawings, wherein.

DETAILED DESCRIPTION OF THE INVENTION

Figure 1:
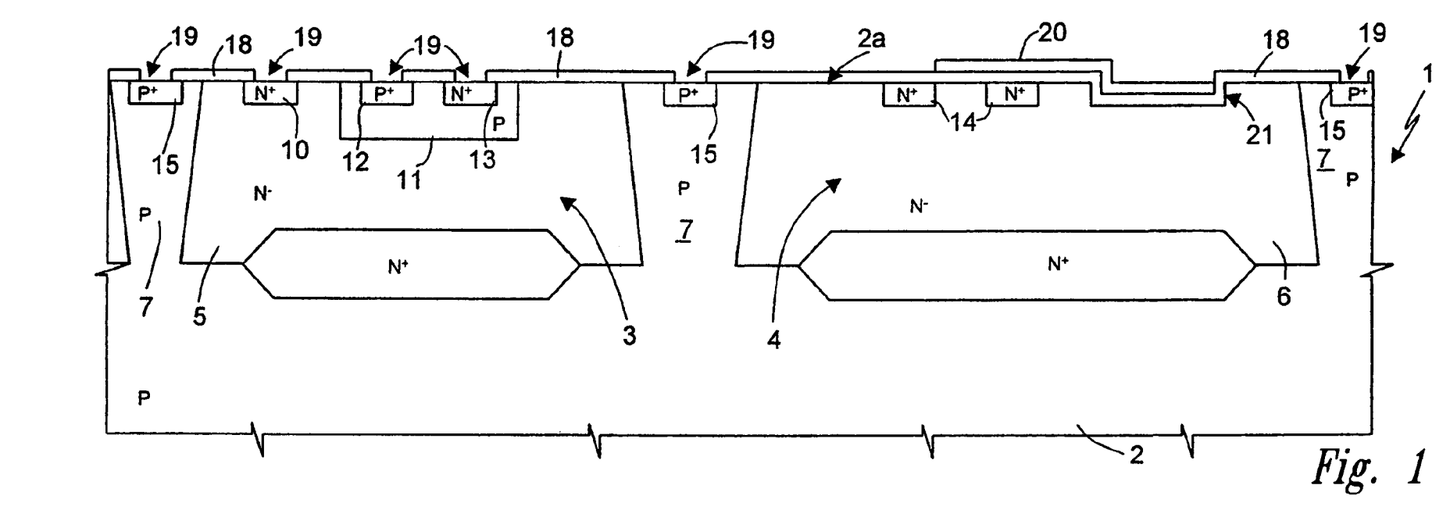
FIG. 1 shows a cross-section of a first wafer housing electronic components for implementing the parallel manufacturing process according to the invention.

FIG. 1 shows a cross-section of a first wafer 1 housing electronic components belonging to an integrated electronic circuit. In particular, the first wafer 1 comprises a substrate 2 having a surface 2a and housing a bipolar transistor 3 and a PMOS transistor 4, each formed in an own well 5, 6 isolated from one another by junction isolation regions 7. The well 5 accommodates a collector contact region 10 and a base region 11, and the base region 11 houses a base contact region 12 and an emitter region 13. The well 6 accommodates source regions 14. In addition, isolation contact regions 15 are formed inside the junction isolation region 7. The collector contact region 10, base region 11, base contact region 12, emitter region 13, source regions 14, and isolation contact regions 15 face the surface 2a of the substrate 2. A dielectric protection layer 18 extends on top of the surface 2a of the substrate 2 and has openings 19 at the regions 10, and 12-15. A gate region 20, of polycrystalline silicon, extends in part on top of the surface 2a and in part in a depression inside the substrate 2, and is electrically insulated from the substrate 2 by the dielectric protection layer 18.

The first wafer 1 is obtained via standard process steps, which are not described in detail herein.

Figure 2:
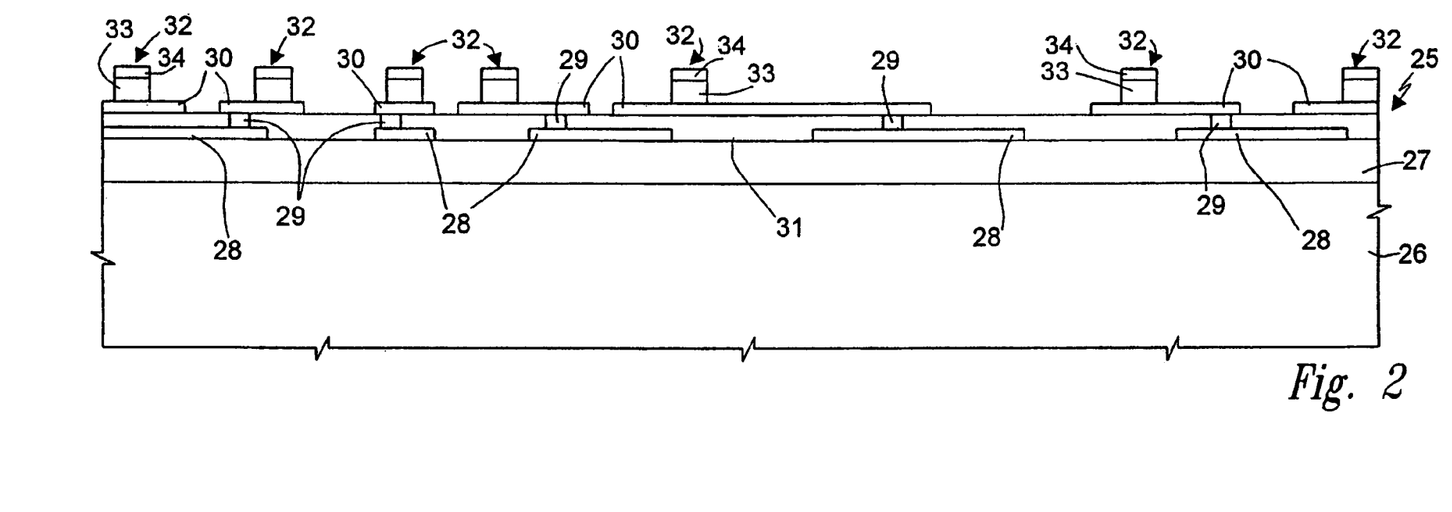
FIG. 2 shows a cross-section of a second wafer housing interconnections for the components of FIG. 1.

FIG. 2 shows a cross-section of a second wafer 25 comprising interconnection regions intended for the first wafer 1 of FIG. 1. In particular, the second wafer 25 comprises a substrate 26 of monocrystalline silicon, covered by an oxide layer 27. Two metal levels are formed on top of the oxide layer 27 and comprise first connection regions 28 on top of the oxide layer 27 and second connection regions 30 on top of the first connection regions 28 and insulated therefrom by an insulating layer 31. Through connections 29 extend through the insulating layer 31 and selectively connect some of the first connection regions 28 to some of the second connection regions 30. Plug elements 32 are formed on top of the second connection regions 30 at the openings 19 and the gate region 20 of the first wafer 1. The plug elements 32 preferably comprise a base region 33, for example of aluminum, and a bonding region 34, of a metal capable of reacting with silicon to form a silicide, such as titanium, palladium, nickel, platinum, tungsten, and cobalt.

The second wafer 25 is preferably obtained as follows: initially the oxide layer 27 is deposited or grown on top of the substrate 26; then a first metal layer is deposited and defined so as to form the first connection regions 28; the insulating layer 31 is deposited; openings are formed in the insulating layer 31 where the through connections 29 are to be made; a second metal layer is deposited and removed from on top of the insulating layer 31; then a third metal layer is deposited and defined so as to form the second connection regions 30; next, a fourth metal layer and a metal layer capable of reacting with silicon are deposited and defined so as to form the plug elements 32. The first and second connection regions 28, 30 and the through connections 29 are made of any suitable metal, even one not necessarily compatible with processing of silicon, such as silver and copper.

Next (FIG. 3), the second wafer 25 is turned upside down on top of the wafer 1 so that the top ends of the plug regions 32 insert into the corresponding openings 19, and, by applying an appropriate temperature (of at least 230° C., according to the type of metal capable of reacting with silicon) and a small pressure, the bonding regions 34 are made to react with the uncovered silicon through the openings 19 or with the polycrystalline silicon of the gate region 20 to form metal silicide which is conductive and stable over time. In this way, a composite wafer 36 is formed.

Figure 3:
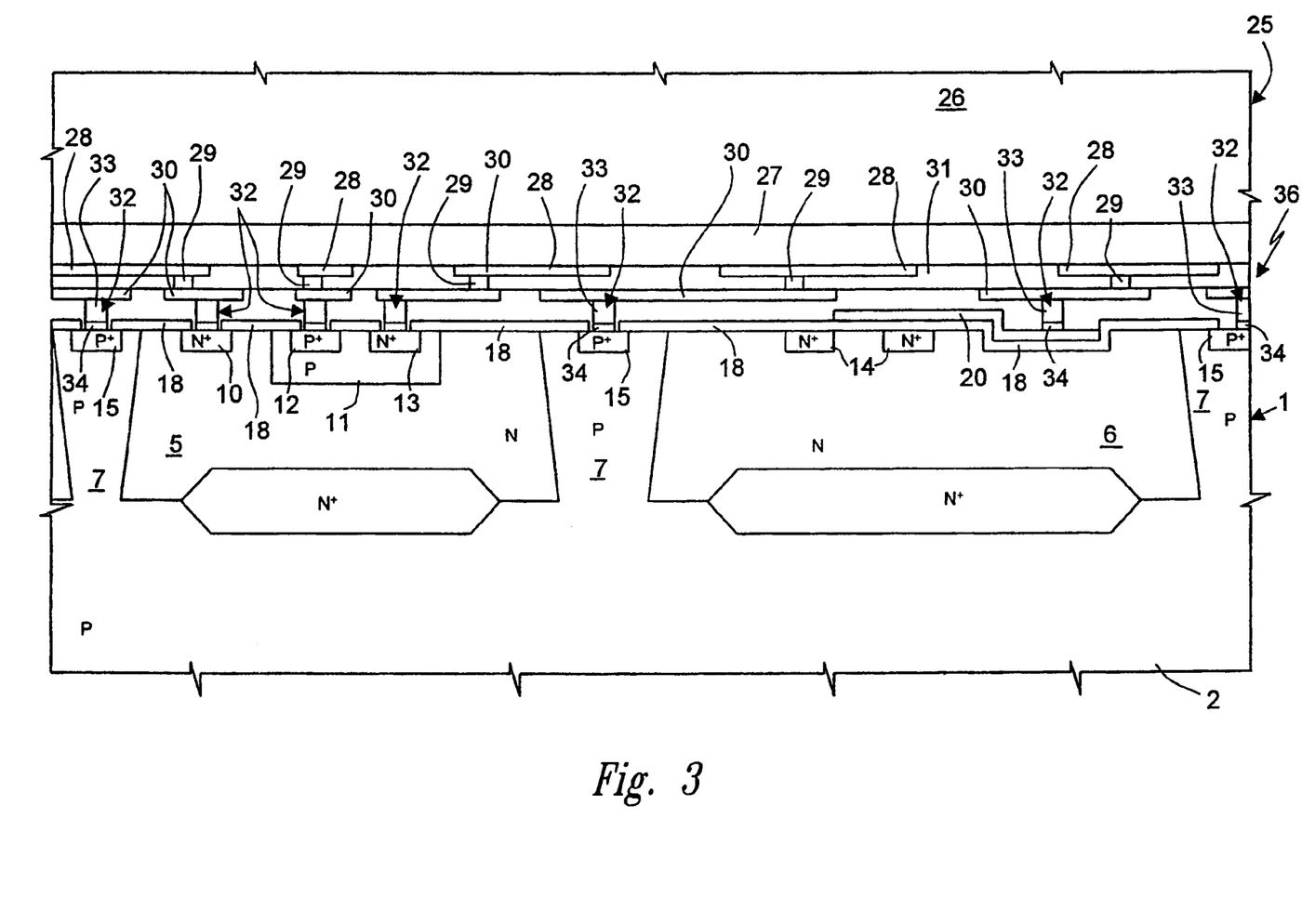
FIG. 3 shows a cross-section of a composite wafer obtained by bonding the wafers of FIGS. 1 and 2.

In order to guarantee the reaction of the bonding regions 34, the silicon exposed at the openings 19 and the polycrystalline silicon of the gate region 20 are preferably cleaned with gaseous anhydrous hydrofluoric acid, and all the silicon regions that are bonded to the plug regions (regions 10 and 12-15, and portion of the gate region 20 on which the contact is made) are on the same level.

Finally (FIG. 4), the second wafer 25 is thinned, for example by lapping, by removing the substrate 26 as far as the oxide layer 27; then the oxide layer 27 is opened in order to enable selective connection of some of the first connection regions 28 with the outside. Alternatively, it is possible to thin the second wafer 25 to arrive near to the oxide layer 27, without, however, reaching the latter. Then, in the remaining portion of the substrate 26, openings are formed at the pads and traverse also the oxide layer 27, and connection wires are then bonded.

Figure 4:
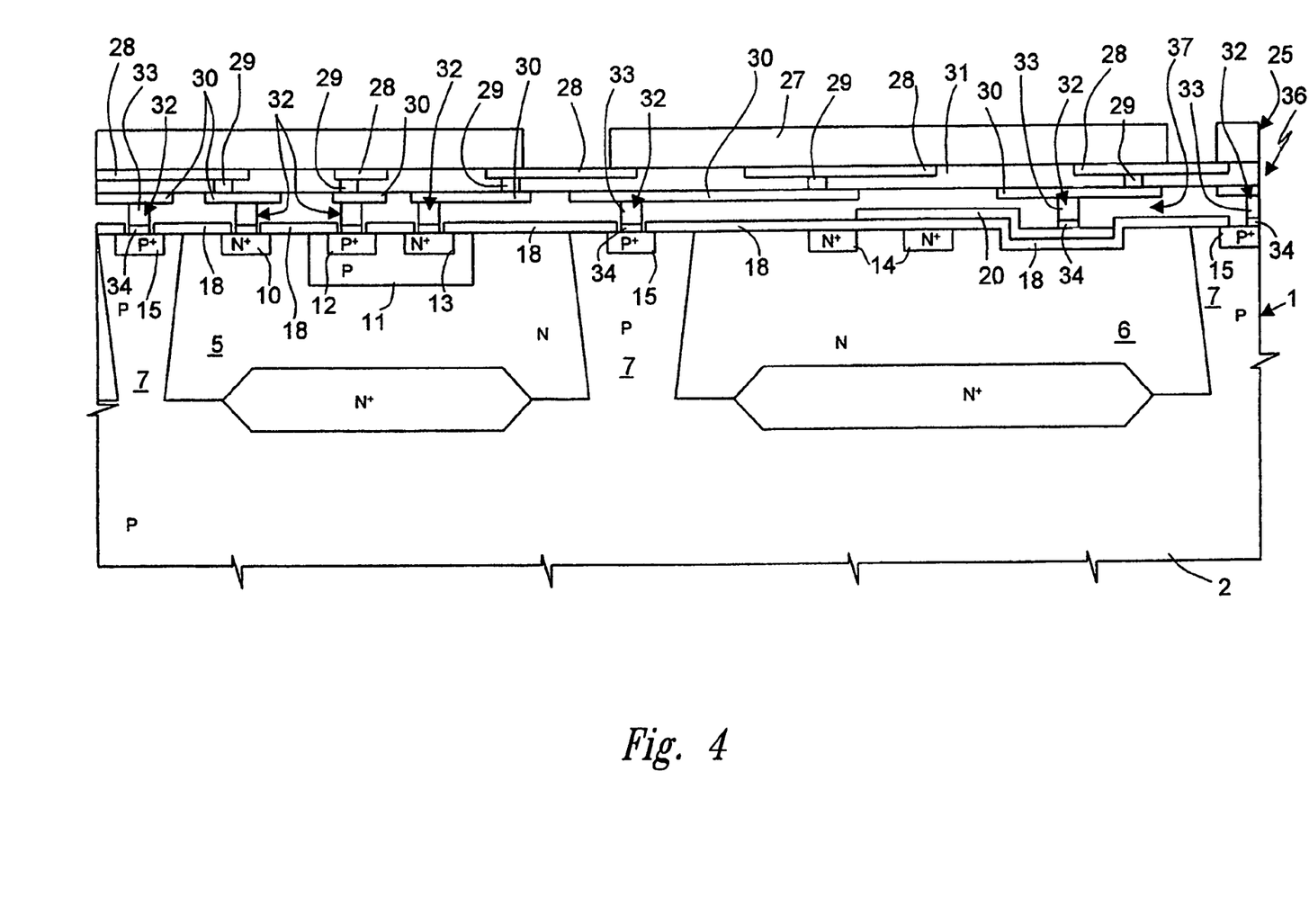
FIG. 4 shows a cross-section of the composite wafer of FIG. 3, in a subsequent step of the manufacturing process.
Figure 5:
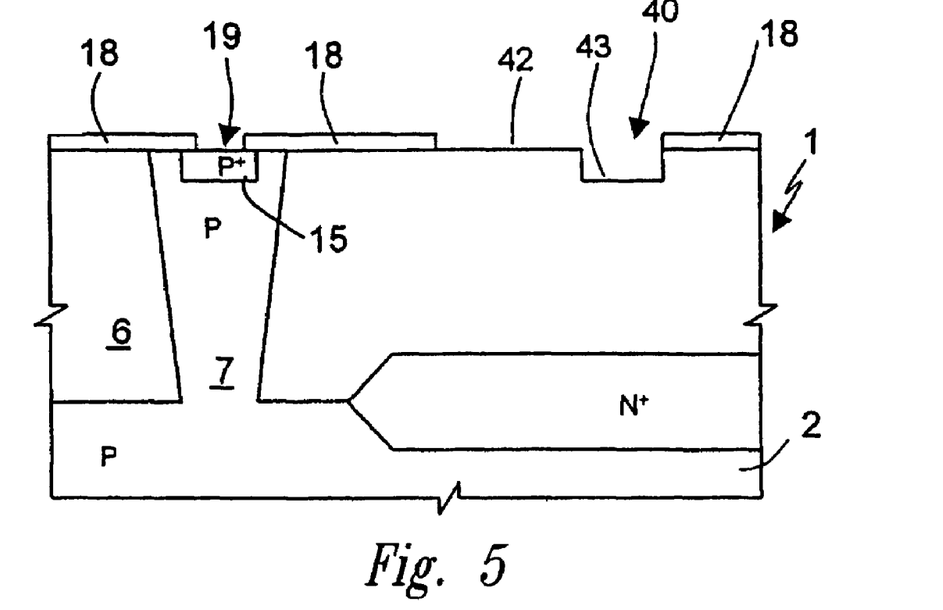
FIG. 5 presents a detail of an alignment structure made on the wafer of FIG. 1.
Figure 6:
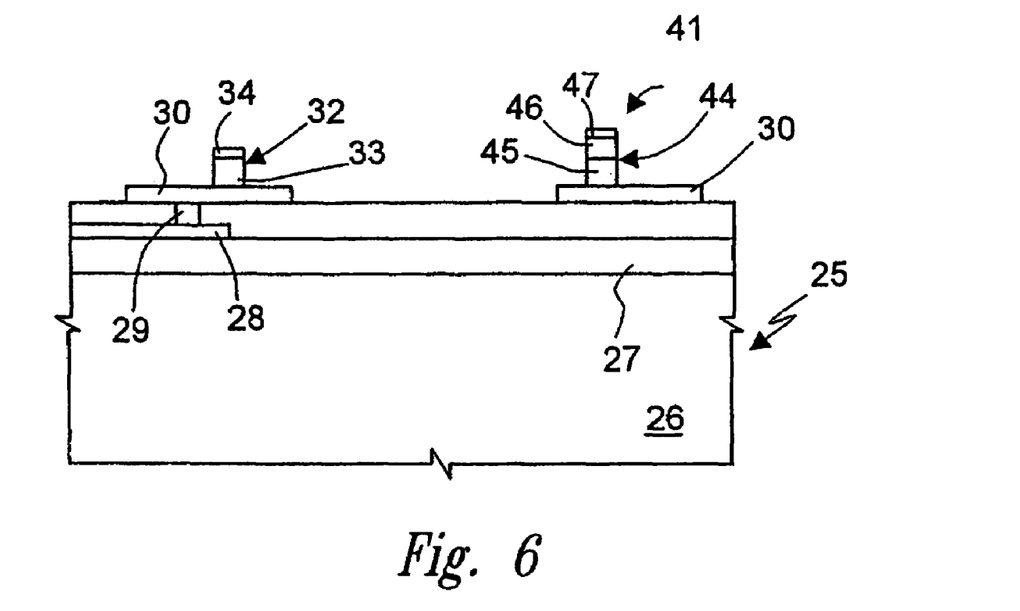
FIG. 6 presents a detail of a corresponding alignment structure made on the wafer of FIG. 2.
Figure 7:
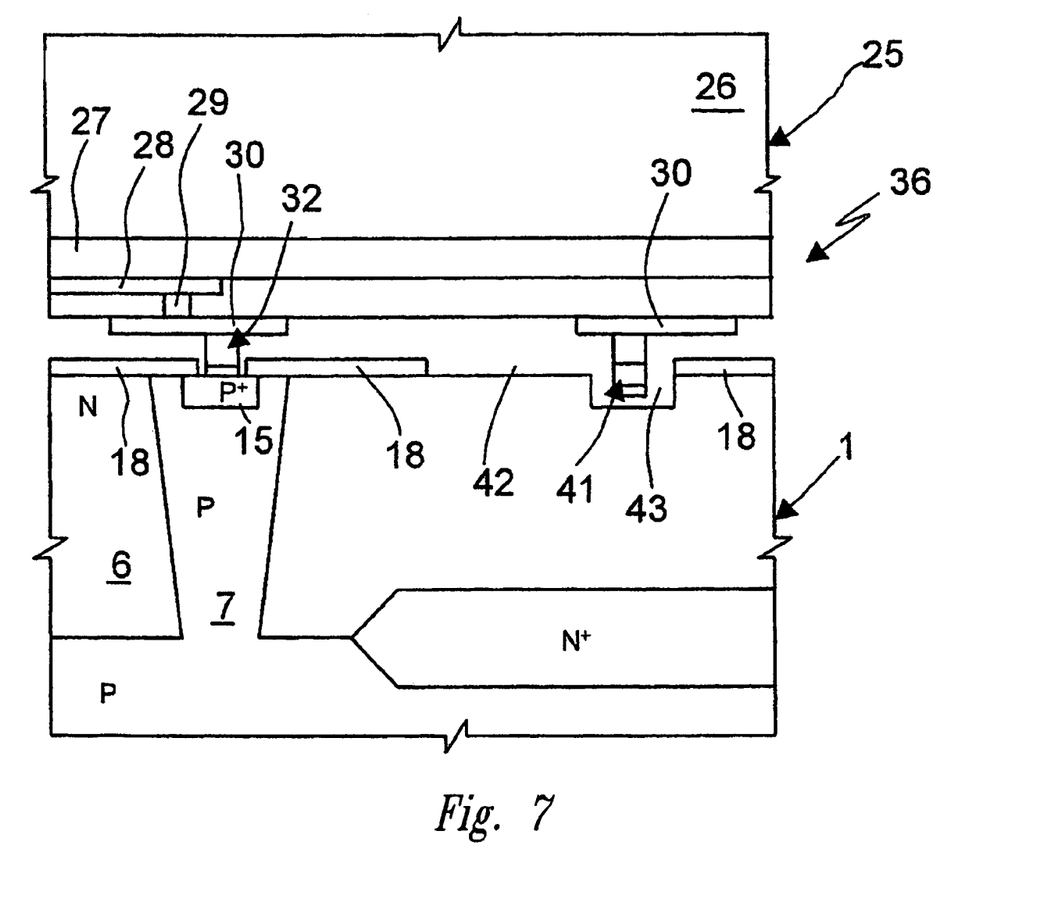
FIG. 7 shows details of FIGS. 5 and 6 after alignment and bonding of the two substrates.

The gap between the first wafer 1 and the second wafer 25 forms an insulation gap 37 having a low dielectric constant and is filled with air or nitrogen, or else is set in vacuum conditions (in the latter two cases, bonding may be performed in a controlled environment as regards gas/pressure, and annular plug elements 32 may be provided which surround the active regions of each device into which the composite wafer 36 will then be divided, so as to seal the insulation gap 37 of each device from the external environment).

The advantages of the above described process are illustrated hereinafter. First, parallel processing allows a reduction in the cycle time, since the steps for manufacturing the second wafer can be carried out even simultaneously with, or in any case independently of, the steps for processing the first wafer.

Since the plug elements 32 belonging to the second wafer 25 are bonded directly to silicon regions belonging to the first wafer 1, the metallurgical operations for forming the connection regions are completely independent of the operations necessary for processing silicon; consequently, there is no interference whatsoever between such operations.

The areas in which the two wafers are made may be separate; consequently, for forming the connections it is possible to use materials that are incompatible with silicon processing, without any risk of contamination.

As far as the interconnections are concerned, it is possible to proceed from the simpler levels (top levels) to the more complex levels (bottom levels, including the first level which is connected directly to silicon), so increasing the sturdiness of the processes.

According to another aspect of the invention, in order to facilitate alignment of the second wafer 25 to the first wafer 1, self-alignment structures are made, as is shown in FIGS. 5-9, where only one portion of the wafers 1, 25 is illustrated.

In detail (FIGS. 5 and 6), the self-alignment structures comprise engagement seats 40 formed in the first wafer 1 and engagement elements 41 formed on the second wafer 25.

Figure 8:
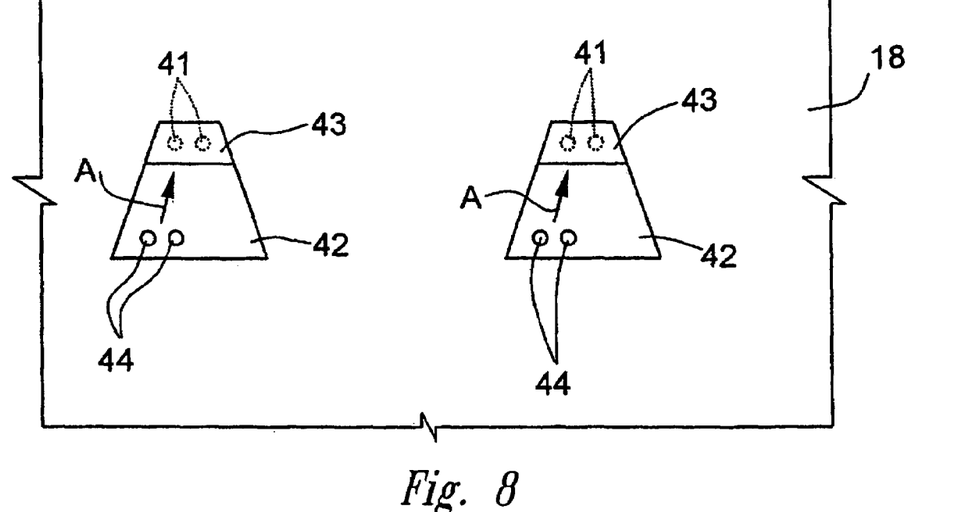
FIG. 8 is a top view of the alignment structure of FIG. 5.
Figure 9:
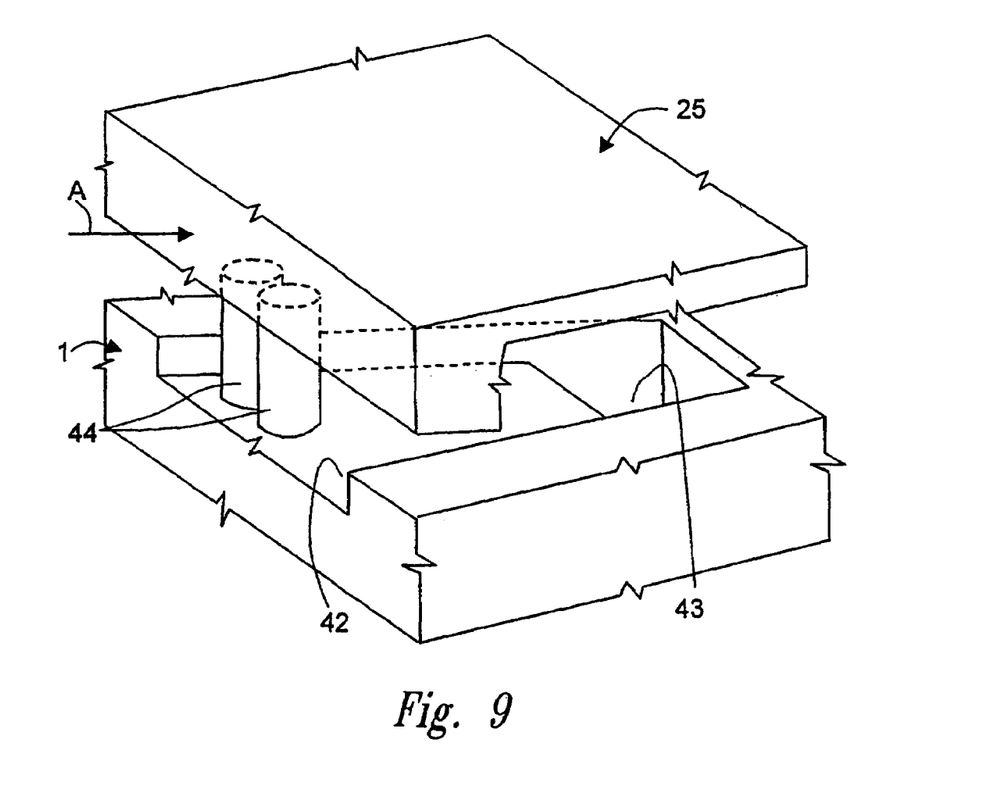
FIG. 9 is a perspective view of the step of aligning the structures of FIGS. 5 and 6.

Specifically, as may be better seen from FIGS. 8 and 9, an engagement seat 40 comprises a guide opening 42 in the protective dielectric layer 18, having a trapezium shape, and a notch 43 in the substrate 2, also having a trapezium shape and with the minor base and the legs substantially aligned, respectively, to the minor base and part of the legs of the guide opening 42. The guide opening 42 has a much greater length (height of the trapezium) than the notch 43.

The engagement seats 40 are obtained as follows: using an appropriate mask or the mask for digging in the silicon used to form the depression 21 (FIG. 1), the notch 43 is initially dug; then, simultaneously and using the same mask as for the openings 19, the guide opening 42 is dug. In this way, the guide opening 42 is positioned precisely with respect to the openings 19.

The engagement elements 41 preferably include two pins 44 for each engagement seat 40, as may be seen in detail in FIGS. 8 and 9. The two pins 44 are arranged adjacent each other and have dimensions and position such as to engage a corresponding notch 43. The two pins 44 of each engagement element 41 are formed on top of a second connection region 30 (which, in actual fact, does not have any function of electrical connection), and each of them comprises a bottom region 45, which may be made of any suitable material (for example, but not necessarily, of the same material as the base regions 33 of the plug elements 32), an intermediate region 46, formed together with and made of the same material as the base regions 33, and a top region 47, formed together with and made of the same material as the bonding regions 34.

Since the pins 44 comprise one region more than the plug elements 32, namely, the bottom region 45, they have a greater height than the plug elements 32 themselves, namely by an amount corresponding to the thickness of the bottom region 45.

The pins 44 are preferably formed as follows: a raising layer is deposited on top of the second connection regions 30 and is then removed everywhere, except where the pins 44 are to be formed, using an appropriate mask. In this step, raising regions are formed having dimensions that may not even coincide with those of the bottom regions 45, but may be of larger dimensions, in particular if the material of the bottom regions 45 is the same as that of the intermediate regions 46.

Next, the fourth metal layer and the metal layer capable of reacting with silicon are deposited and defined, so as to form simultaneously the plug elements 32 and the intermediate regions 46 and top regions 47. If the material of the raising regions is the same as the fourth metal layer, also the bottom regions 45 are defined in this step, even though this is not always indispensable.

When the second wafer 25 is turned upside down on top of the first wafer 1, it is roughly aligned in order to insert the pins 44 into the guide openings 42 next to the major bases of the trapeziums, as shown in FIG. 8 with a solid line, and in FIG. 9. Next, the second wafer 25 is displaced laterally with respect to the first wafer 1 in the direction indicated by the arrows A, until the pairs of pins 44 insert into the corresponding notches 43, thus causing the second wafer 25 to collapse towards the first wafer 1 and the plug elements 32 to engage the corresponding openings 19. Preferably, the height of the pins 44 and the depth of the notches 43 is chosen in such a way that the pins 44 do not touch the bottom of the notches 43, so as to guarantee that, even in the presence of process imprecisions, the plug elements 32 are always and securely in contact with the substrate 2 and the gate region 20 of the first wafer 1.

Lateral movement of the second wafer 25 ends when the two pins 44 of each engagement element 41 both interfere with the legs of the guide openings 42 and possibly of the notches 43, fittedly engaged, as shown by the dashed lines in FIG. 8, and so guaranteeing excellent alignment of the wafers 1 and 25.

Figure 10:
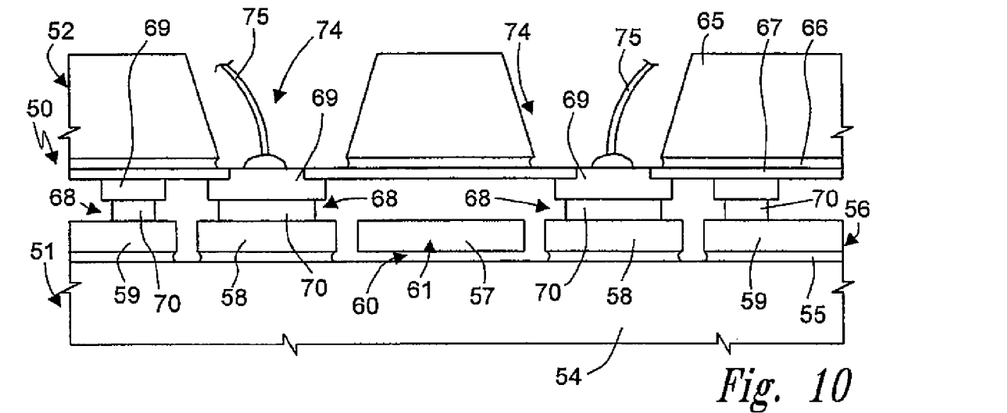
FIG. 10 shows a cross-section of a first MEMS device formed using the parallel fabrication technique according to the invention.

FIG. 10 shows a device 50 formed by a first chip 51 housing a micro-electromechanical structure 61 and a second chip 52 housing electrical connection regions.

In detail, the first chip 51 comprises a first substrate 54 of monocrystalline silicon, a first insulating layer 55, for example of silicon dioxide, and an epitaxial layer 56 of polycrystalline silicon. The epitaxial layer 56 houses the micro-electromechanical structure 61, including a rotor 57, a stator 58, and biasing regions 59. The first insulating layer 55 has been removed from beneath the rotor 57 where an air gap 60 is formed in order to enable movement of the rotor 57, which is supported by spring elements (not shown) in a per se known manner.

The second chip 52 comprises a second substrate 65, of monocrystalline silicon, a second insulating layer 66, of silicon dioxide, a third insulating layer 67, of silicon nitride, and plug elements 68, each of which includes a base region 69, for example of aluminum, and a bonding region 70, of silicide, such as titanium silicide, palladium silicide, nickel silicide, platinum silicide, tungsten silicide, and cobalt silicide.

The second substrate 65 has through openings 74 at some plug elements 68. Underneath the through openings 74 also the second insulating layer 66 and the third insulating layer 67 are removed. Thereby, the corresponding base regions 69 are accessible from behind and are connected to electrical connection wires 75 soldered through a gold ball (gold-wire bonding technique).

The device 50 is formed as follows: the first insulating layer 55 is deposited or grown on a first wafer of crystalline silicon (forming the first substrate 54); next, a thin layer of polycrystalline silicon is deposited, and an epitaxial layer 56 is grown. Alternatively, it is possible to use a SOI wafer. Using a trench mask, micro-electromechanical structures 61 are defined; then the first insulating layer 55 is removed from beneath the rotor 57.

Separately, the second insulating layer 66 is deposited or grown on a second silicon wafer (forming the substrate 65). The third insulating layer 67 is deposited. Using an appropriate mask, openings are formed in the third insulating layer 67. Then a metal layer, for example of aluminum, is deposited and defined to form the base regions 69. A layer of a metal capable of reacting with silicon is deposited and defined to form the bonding regions 70. Possibly, using an appropriate etching technique, the base regions 69 and the bonding regions 70 can be defined together using a single mask. Next, using an appropriate mask, positioning structures, for example notches, are formed on the rear of the second wafer, i.e., on the side opposite that on which the second insulating layer 66 and the third insulating layer 67 have been formed.

Subsequently, the second wafer is turned upside down on the first wafer, using the positioning structures present on the rear of the second wafer and possibly exploiting the technique of precise self-alignment described with reference to FIGS. 6-9. Subsequently, by heating to an appropriate temperature and applying a small pressure, the bonding regions 70 are soldered on the corresponding regions (here, the stator 58 and the biasing regions 59) of the micro-electromechanical structures 61, forming metal silicide. The second wafer is thinned, for example by milling, down to a thickness of between 50 and 100 µm, and, using an appropriate mask, the through openings 74 are formed. Then the portions of the second insulating layer 66 at the through openings 74 are removed, thus uncovering from the rear the base regions 69, which must be accessible for bonding. The composite wafer thus obtained is then cut into dice and positioned where required, and the electrical connection wires 75 are soldered.

Figure 11:
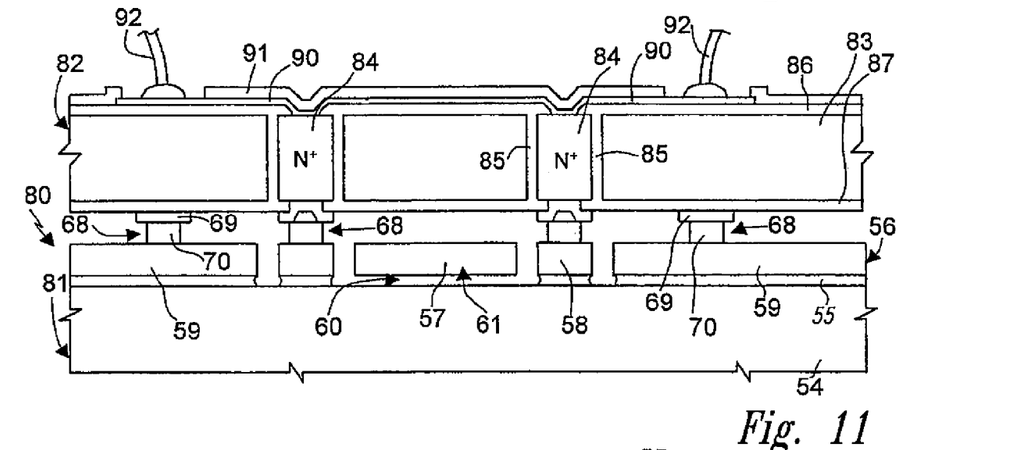
FIG. 11 shows a cross-section of a second MEMS device formed using the parallel fabrication technique according to the invention.

FIG. 11 shows a device 80 including a first chip 81, similar to the first chip 51 of FIG. 10 (and hence its parts are designated by the same reference numbers and will not be further described herein), and a second chip 82 housing electrical connection regions obtained using the technique of silicon plugs.

The second chip 82 comprises a silicon substrate 83 accommodating through connection regions 84, having conductivity N+ and insulated from the rest of the substrate 83 by annular insulation regions 85 of silicon dioxide. A top silicon layer 86 covers the rear of the substrate 83, and a bottom oxide layer 87 covers the front of the substrate 83. Plug regions 68, similar to the plug regions 68 of FIG. 10, join the second chip 82 to the first chip 81. Some of the plug regions 68 are in electrical contact with the through connection regions 84 and extend through corresponding openings present in the bottom oxide layer 87.

Electrical connection regions 90, for example of aluminum, extend over the top of oxide layer 86 and are in electrical contact with the through connection regions 84 through openings made in the top oxide layer 86. A protection layer 91, of silicon nitride, covers the electrical connection regions 90 and the top oxide layer 86, except for openings where electrical connection wires 92 are soldered to the electrical connection regions 90 through gold-wire bonding.

The device 80 is manufactured as described hereinafter. A first wafer, accommodating the first chip 81, is formed as described previously in connection with FIG. 10. The second chip 82 is manufactured from a second wafer comprising a monocrystalline-silicon sacrificial substrate, the top oxide layer 86, and the substrate 83, for example a SOI wafer or a wafer obtained by epitaxial growth starting from a polysilicon germ layer deposited over the top oxide layer 86.

Using a deep trench mask, the substrate 83 is etched as far as the top oxide layer 86. Then an oxide layer is deposited and fills the trenches just obtained and forms the annular insulation regions 85 and the bottom oxide layer 87. After possible planarization of the bottom oxide layer 87, using an appropriate mask openings are formed in the bottom oxide layer 87, so as to uncover the substrate 83 at the through connection regions 84. Next, plug regions 68 are formed as described above. As previously, using an appropriate mask, positioning structures (notches) are made on the rear of the second wafer.

Next, the second wafer is turned upside down, aligned and bonded to the first wafer, as above described, for example in a controlled environment. Subsequently, the second wafer is thinned by completely removing the sacrificial layer until the top oxide layer 86 is uncovered. Using an appropriate mask, openings are formed in the top oxide layer 86. A metal layer, for example of aluminum, is deposited and defined to form electrical connection regions 90. The protection layer 91 is deposited and defined. The wafer is cut into dice, and the electrical connection wires 92 are formed. Alternatively, deep trenches are formed in the second wafer and are filled with insulating material deposited to form the annular insulation regions 85 and the bottom oxide layer 87. The second wafer is turned upside down and bonded to the first wafer; then it is reduced in thickness until the annular insulation regions are reached from the rear. Next, the top oxide layer 86, the electrical connection regions 90, and the protection layer 91 are formed. Finally, the composite wafer is cut into dice, and the electrical connection wires 92 are made.

Figure 12:
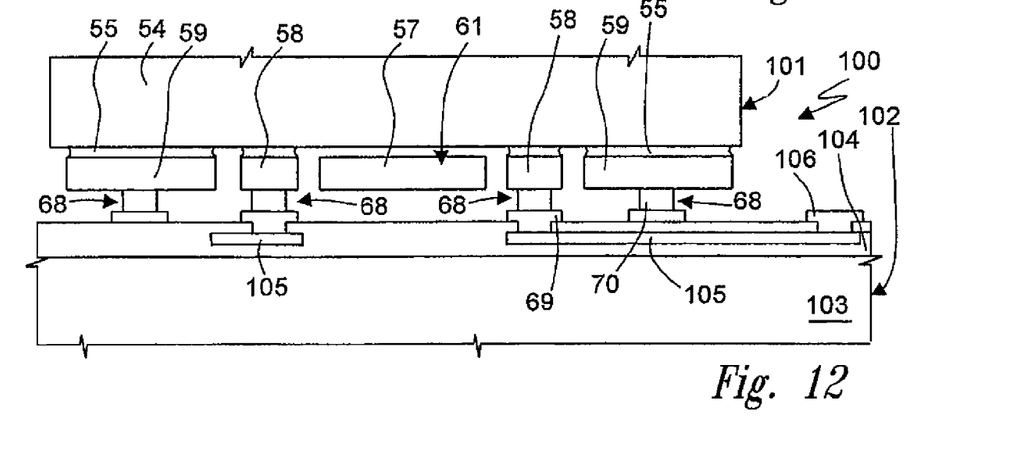
FIG. 12 shows a cross-section of a third MEMS device formed using the parallel fabrication technique according to the invention.
Figures 13, 14:
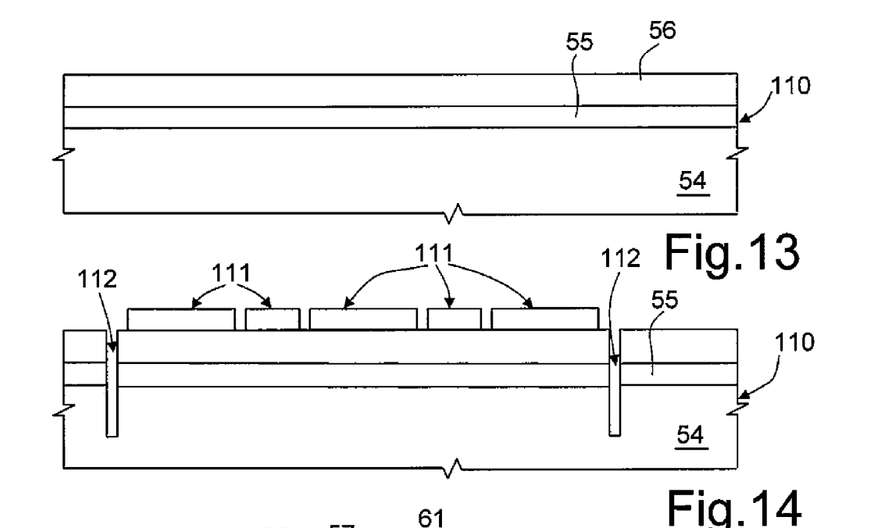
FIGS. 13-15 show cross-sections of a first wafer used for manufacturing the third MEMS device according to FIG. 11, in successive steps.
Figure 15:
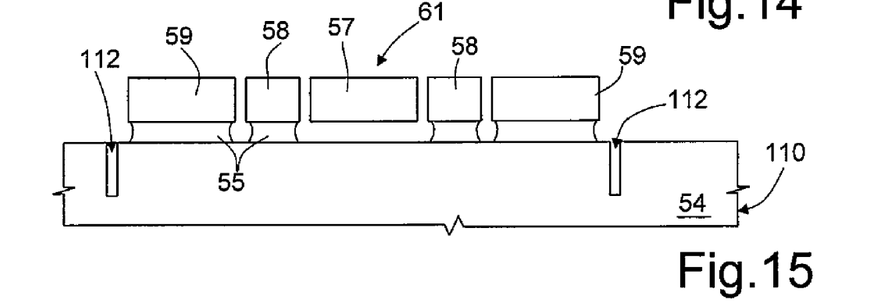
Figure 16:
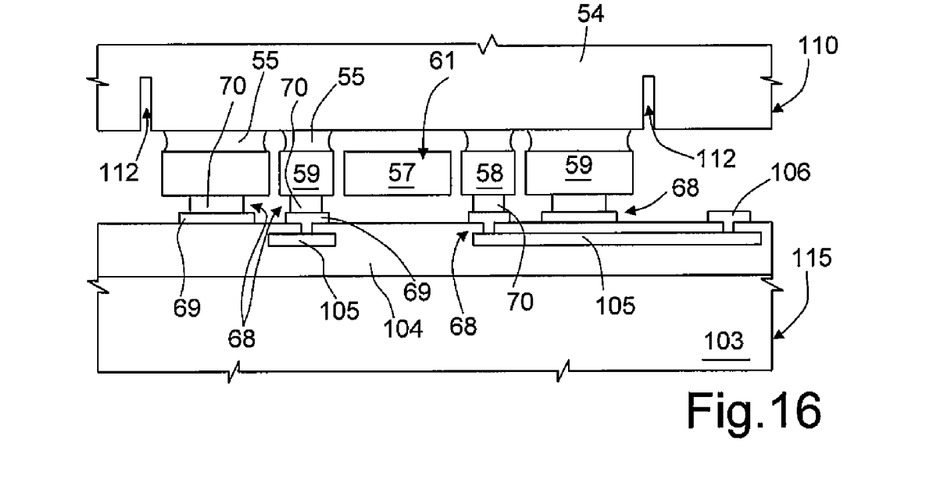
FIG. 16 shows a cross-section of a composite wafer obtained by bonding the wafer of FIG. 15 to a wafer housing interconnections, in an advanced manufacturing step.

FIG. 12 shows a device 100 including a first chip 101, similar to the first chip 51 of FIG. 10 (and hence its parts are designated by the same reference numbers and will not be further described herein), and a second chip 102 housing electrical connection regions which are directly accessible. The first chip 101 has a smaller area than the second chip 102, so that the chip 102 projects on one side beyond the first chip 101.

The second chip comprises a substrate 103 coated with an insulating layer 104, for example of silicon dioxide. Connection regions 105 belonging to a same metal level extend inside the insulating layer 104. Plug elements 68, similar to the plug elements of FIG. 10, are formed on the surface of the insulating layer 104; some of them being in electrical contact, through the base region 69, with the connection regions 105. The plug elements 68 guarantee bonding between the first chip 101 and the second chip 102, as shown in FIGS. 10 and 11. In addition, a contact region 106 is present on the surface of the insulating layer 104, in the area that is not covered by the first chip 101 and is connected to a respective connection region 105 to enable connection with the outside world.

The device 100 of FIG. 12 is manufactured as illustrated in FIGS. 13-16. As for the device 50 of FIG. 10, a first wafer 110 comprises a sandwich of the substrate 54, the insulating layer 55, and the epitaxial layer 56. Next (FIG. 14), after planarization of the surface of the epitaxial layer 56, for example by chemical-mechanical polishing (CMP), a trench mask 111 is deposited, and, using a blade, notches 112 are made in the first chip 101 starting from the surface of the epitaxial layer 56, through the insulating layer 55 and through most of the thickness of the substrate 54.

Next (FIG. 15), the micro-electromechanical structures 61 are defined, and the first insulating layer 55 is removed from beneath the rotor 57 (to form an air gap 60) and from outside the biasing regions 59.

A second wafer 115 (FIG. 16) is processed separately. In detail, on the substrate 103, a first oxide layer is initially deposited or grown; a metal layer is deposited and defined so as to form the connection regions 105; a second oxide layer is deposited so as to form, together with the first oxide layer, the insulating layer 104; the insulating layer 104 is opened to form vias; an aluminum layer is deposited and defined to form the base regions 69 and the contact regions 106; and a layer of a metal capable of reacting with silicon is deposited and defined to obtain the bonding regions 70.

Next (FIG. 16), the first wafer 110 is turned upside down, aligned to the second wafer 115, and bonded as described above. Then the substrate 54 of the second wafer 110 is thinned. The composite wafer 116 thus obtained is cut into dice, and the external portions of the first wafer 110 are removed, exploiting the notches 112, to obtain the structure of FIG. 12.

Finally, it is clear that modifications and variations may be made to the process and the devices described and illustrated herein, all falling within the scope of the invention, as defined in the attached claims. In particular, electronic components and/or micro-electromechanical systems may be integrated in the first wafer; and the second wafer may have any number of metal levels, from one up to five or six, according to the technology adopted and to the particular requirements.

The invention claimed is:

1. An integrated device comprising:
   a first body of semiconductor material housing integrated structures including semiconductor regions and isolation regions; and
   a second body of semiconductor material carrying interconnection structures of conductive material, said interconnection structures including plug elements in direct contact with said semiconductor regions and having a first region of a first material and a bonding region of a second material, resulting from a reaction of said semiconductor regions with a metal material, different from said first material.

2. The device according to claim 1, wherein said semiconductor material is silicon, and said second material, resulting from the reaction of said semiconductor regions with said metal material, is a metal silicide.

3. The device according to claim 1, wherein said metal material is chosen from among titanium, nickel, platinum, palladium, tungsten, and cobalt.

4. The device according to claim 1, wherein said plug elements have a height, said first body comprises an insulating material layer on top of a substrate of semiconductor material, said insulating material layer having a thickness smaller than the height of said plug elements, and openings uncovering selective portions of said substrate, and wherein said bonding region is bonded to said selective portions of said semiconductor regions.

5. The device according to claim 1, wherein said first body comprises an insulating material layer on top of a substrate of semiconductor material and conductive regions of semiconductor material on top of said insulating material layer, and wherein said bonding region is bonded to said conductive regions.

6. The device according claim 1, wherein said integrated structures comprise integrated electronic components.

7. The device according to claim 1, wherein said integrated structures comprise micro-electromechanical systems.

8. A device, comprising:
first and second semiconductor wafer dies lying in substantially parallel planes; and
a plurality of plug elements positioned between the first and second wafer dies, each plug element having a first region of a first material coupled to a first side of the first wafer die and a second region of a second, metal, material, different from the first material, bonded to a respective one of a plurality of semiconductor material portions of the second wafer die and including a silicide formed by a reaction between the metal and the semiconductor material.

9. The device of claim 8 wherein the first material is aluminum.

10. The device of claim 8 wherein the second material is selected from among titanium, palladium, nickel, platinum, tungsten, and cobalt.

11. The device of claim 8, wherein each of the respective semiconductor material portions of the second wafer die is defined by a respective opening formed in a dielectric layer formed on a semiconductor substrate of the second wafer die.

12. The device of claim 8, comprising an electronic component formed in a semiconductor substrate of the second wafer die, individuals of the plurality of plug elements being in electrical contact with respective terminals of the electronic component via the respective semiconductor material portion.

13. The device of claim 8, comprising a plurality of connection regions formed in the first wafer die and to which the first regions of corresponding ones of the plurality of plug elements are coupled.

14. The device of claim 8, comprising:
a dielectric layer formed on a semiconductor substrate of the second wafer die and having an opening formed therein such that a portion of a surface of the semiconductor substrate is exposed by the opening;
a cavity formed in the semiconductor substrate in the portion of the surface exposed by the opening; and
an alignment pin formed on the first wafer die opposite the cavity, such that an upper end of the pin lies within the cavity.

15. The device of claim 14 wherein a relative length of the pin and depth of the cavity are such that the upper end of the pin does not contact a bottom of the cavity.

16. The device of claim 14 wherein the opening in the dielectric layer and the cavity each have a trapezium shape, the cavity having a smaller shape than the opening, and wherein the opening and the cavity are positioned such three walls of the cavity are substantially aligned with three walls of the opening.

17. The device of claim 8, comprising a micro-electromechanical structure formed in the second wafer die.

18. The device of claim 17 wherein the micro-electromechanical structure includes terminals electrically coupled to respective ones of the plurality of semiconductor material portions.

19. The device of claim 17 wherein the micro-electromechanical structure includes a rotor and a stator.

20. The device of claim 8, comprising a through opening in the first wafer die.

21. The device of claim 20 wherein the through opening is positioned such that a portion of the first region of one of the plurality of plug elements is exposed from an opposite side of the first wafer die.

22. The device of claim 21, comprising a wire bond connection to the one of the plurality of plug elements via the through opening, the wire bond connection being in electrical contact with the respective semiconductor material portion of the second wafer die via the plug element.

23. The device of claim 8, comprising:
a through connection region formed in the first wafer die in electrical contact with one of the plurality of plug elements on a first side of the first wafer die; and
an annular insulation region surrounding the through connection region and isolating it from other portions of the first wafer die.

24. The device of claim 23, further comprising a connection region formed at a second side of the first wafer die in electrical contact with the through connection region, the connection region being in electrical contact with the respective semiconductor material portion of the second wafer die via the one of the plurality of plug elements and the through connection region.

25. The device of claim 8, comprising:
a layer of conductive material formed in the first wafer die in electrical contact with one of the plurality of plug elements;
a contact region, formed on a surface of the first side of the first wafer die, in electrical contact with the layer of conductive material; and
wherein the second wafer die is sized and positioned such that the contact region on the surface of the first wafer die is exposed.

26. A device, comprising:
a first semiconductor die;
a second semiconductor wafer die in a parallel relationship with the first die;
a micro-electromechanical structure formed in the second die;
means for mechanically and electrically coupling the first and second dies such that they remain in the parallel relationship and that electrical contacts provided on the first die are electrically coupled with components of the second die, without formation of metallic deposits on the second die, wherein the coupling means comprise plug elements having first and second material components;
a through connection region formed in the first semiconductor die in electrical contact with one of the plurality of plug elements on a first side of the first die; and
an annular insulation region surrounding the through connection region and isolating it from other portions of the first die.

27. The device of claim 26 wherein the second material component of the plug elements includes a metallic silicide formed by a reaction between a metal of the second material component and silicon material of the second semiconductor wafer die.

* * * * *